United States Patent
Rohatgi et al.

(10) Patent No.: US 7,842,596 B2
(45) Date of Patent: Nov. 30, 2010

(54) METHOD FOR FORMATION OF HIGH QUALITY BACK CONTACT WITH SCREEN-PRINTED LOCAL BACK SURFACE FIELD

(75) Inventors: Ajeet Rohatgi, Marietta, GA (US); Vichai Meemongkolkiat, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 72 days.

(21) Appl. No.: 12/116,100

(22) Filed: May 6, 2008

(65) Prior Publication Data

US 2009/0017617 A1   Jan. 15, 2009

Related U.S. Application Data

(60) Provisional application No. 60/916,327, filed on May 7, 2007.

(51) Int. Cl.
*H01L 21/44* (2006.01)

(52) U.S. Cl. ............... 438/610; 438/38; 257/E21.496; 257/E21.477

(58) Field of Classification Search .................. 438/38, 438/72, 610; 257/E21.496, E21.477, E21.582, 257/E21.584

See application file for complete search history.

(56) References Cited

U.S. PATENT DOCUMENTS

| | | |
|---|---|---|
| 4,105,471 A | 8/1978 | Yerkes et al. |
| 4,163,678 A | 8/1979 | Frosch et al. |
| 4,235,644 A | 11/1980 | Needes |
| 4,442,310 A | 4/1984 | Carlson et al. |
| 5,011,782 A | 4/1991 | Lamb et al. |

(Continued)

FOREIGN PATENT DOCUMENTS

EP        0 999 598 A1      5/2000

(Continued)

OTHER PUBLICATIONS

Rentsch J., et al. "Technology Route Towards Industrial Application of Rear Passivated Silicon Solar Cells," Photovoltaic Energy conversion, Conference Record of the 2006 IEEE 4$^{th}$ World Conference on, IEEE, PI, May 1, 2006, pp. 1008-1011, XP031007477, ISBN: 978-1-422-0016-4, p. 1008-1010; figure 1, Freiburg, Germany.

(Continued)

*Primary Examiner*—Caridad M Everhart
(74) *Attorney, Agent, or Firm*—Alston & Bird LLP (57) ABSTRACT

A thin silicon solar cell having a back dielectric passivation and rear contact with local back surface field is described. Specifically, the solar cell may be fabricated from a crystalline silicon wafer having a thickness from 50 to 500 micrometers. A barrier layer and a dielectric layer are applied at least to the back surface of the silicon wafer to protect the silicon wafer from deformation when the rear contact is formed. At least one opening is made to the dielectric layer. An aluminum contact that provides a back surface field is formed in the opening and on the dielectric layer. The aluminum contact may be applied by screen printing an aluminum paste having from one to 12 atomic percent silicon and then applying a heat treatment at 750 degrees Celsius.

19 Claims, 11 Drawing Sheets

U.S. PATENT DOCUMENTS

| | | | |
|---|---|---|---|
| 5,230,746 | A | 7/1993 | Wiedeman et al. |
| 5,369,300 | A | 11/1994 | Heideman et al. |
| 5,468,652 | A | 11/1995 | Gee |
| 5,510,271 | A | 4/1996 | Rohatgi et al. |
| 5,698,451 | A | 12/1997 | Hanoka |
| 5,726,065 | A | 3/1998 | Szlufcik et al. |
| 5,766,964 | A | 6/1998 | Rohatgi et al. |
| 5,871,591 | A | 2/1999 | Ruby et al. |
| 5,899,704 | A | 5/1999 | Schlosser et al. |
| 5,928,438 | A | 7/1999 | Salami et al. |
| 6,069,065 | A | 5/2000 | Arimoto et al. |
| 6,071,753 | A | 6/2000 | Arimoto |
| 6,091,021 | A | 7/2000 | Ruby et al. |
| 6,093,882 | A | 7/2000 | Arimoto |
| 6,096,968 | A | 8/2000 | Schlosser et al. |
| 6,207,890 | B1 | 3/2001 | Nakai et al. |
| 6,291,763 | B1 | 9/2001 | Nakamura |
| 6,294,459 | B1 | 9/2001 | Yin et al. |
| 6,380,479 | B2 | 4/2002 | Nakai et al. |
| 6,423,631 | B1 | 7/2002 | Iyer et al. |
| 6,444,588 | B1 | 9/2002 | Holscher et al. |
| 6,495,450 | B1 | 12/2002 | Iyer et al. |
| 6,524,880 | B2 | 2/2003 | Moon et al. |
| 6,541,843 | B2 | 4/2003 | Yin et al. |
| 6,673,713 | B2 | 1/2004 | Yin et al. |
| 6,695,903 | B1 | 2/2004 | Kubelbeck et al. |
| 6,825,409 | B2 | 11/2004 | Haussler et al. |
| 7,144,751 | B2 | 12/2006 | Gee et al. |
| 7,196,018 | B2 * | 3/2007 | Szlufcik et al. ............ 438/745 |
| 7,495,167 | B2 * | 2/2009 | Joge et al. ................ 136/249 |
| 2004/0065362 | A1 | 4/2004 | Watabe et al. |
| 2004/0261840 | A1 | 12/2004 | Schmit et al. |
| 2005/0189015 | A1 | 9/2005 | Rohatgi et al. |
| 2005/0268963 | A1 | 12/2005 | Jordan et al. |
| 2006/0130891 | A1 * | 6/2006 | Carlson .................... 136/256 |
| 2007/0175508 | A1 | 8/2007 | Park |
| 2007/0221270 | A1 * | 9/2007 | Watsuji et al. ............ 136/256 |
| 2007/0256733 | A1 | 11/2007 | Karakida et al. |
| 2008/0000519 | A1 | 1/2008 | Takahashi |
| 2009/0101190 | A1 * | 4/2009 | Salami et al. ............... 136/244 |

FOREIGN PATENT DOCUMENTS

| | | | |
|---|---|---|---|
| EP | 1763086 | * | 3/2007 |
| EP | 1763086 A1 | | 3/2007 |
| JP | 2007-220707 | | 8/2007 |
| WO | WO89/12321 | * | 12/1989 |
| WO | WO 97/13280 | | 4/1997 |
| WO | 2006097303 | * | 9/2006 |
| WO | WO 2006/097303 A1 | | 9/2006 |
| WO | WO 2007/032151 | * | 3/2007 |
| WO | WO 2007/059551 A1 | | 5/2007 |
| WO | WO 2007/059578 A1 | | 5/2007 |
| WO | WO 2008/039067 A2 | | 4/2008 |

OTHER PUBLICATIONS

Szlufcik, J., et al. "Low-Cost Industrial Technologies of Crystalline Silicon Solar Cells," Proceedings of the IEEE, IEEE, vol. 85, No. 5, May 1, 1997, pp. 7-11-730, XP011043842, ISSN: 0018-9210, pp. 716-720; figures 7, 11, New York.

Schultz, O., et al. "Dielectric Rear Surface Passivation for Industrial Multicrystalline Silicon Solar Cells," Photovoltaic Energy Conversion, Conference Record of the 2006 IEEE $4^{th}$ World Conference on, IEEE, PI, May 1, 2006, pp. 885-889, XP031007447, ISBN: 978-1-14244-0016-4, Freiburg, Germany.

Schneiderlochner E., et al., "Investigations on Laser-Fired Contracts for Passivated Rear Solar Cells," 20020519; 20020519-20020524, vol. Conf. 29, May 19, 2002, pp. 300-303, XP010666288, Gelsenkirchen, Germany.

International Search Report from corresponding PCT/US2008/005863 received Aug. 26, 2008.

Office Action for U.S. Appl. No. 12/116,115 dated Oct. 13, 2010.

Ebong et al., The Effect of Low and High Temperature Anneals on the Hydrogen Content and Passivation of Si Surface Coated with $SiO_2$ and SiN Films, 1999, pp. 1921-1924, Journal of the Electrochemical Society.

Narasimha et al., Optimized Aluminum Back Surface Field Techniques for Silicon Solar Cells, Sep. 30-Oct. 3, 1997, pp. 63-66, IEEE.

Office Action for Chinese Application No. 200880015133.9 dated Sep. 14, 2010.

* cited by examiner

METHOD FOR FORMATION OF HIGH QUALITY BACK CONTACT WITH SCREEN-PRINTED LOCAL BACK SURFACE FIELD

CROSS REFERENCE TO RELATED APPLICATIONS

The present application claims priority to and the benefit of U.S. Provisional Patent Application No. 60/916,327, filed May 7, 2007.

GOVERNMENT INTERESTS

The U.S. Government has a paid-up nonexclusive, worldwide license in this invention and the right in limited circumstances to require the patent owner to license others on reasonable terms as provided for by the terms of contract No. DE-FC36-07GO17023 awarded by the U.S. Department of Energy.

FIELD OF THE INVENTION

The present invention generally relates to silicon solar cells. More particularly, the present invention relates to a formation of a back or rear contact that provides back surface passivation and optical confinement properties.

BACKGROUND OF THE INVENTION

Solar cells are devices that convert light energy into electrical energy. These devices are also often called photovoltaic (PV) cells. Solar cells are manufactured from a wide variety of semiconductors. One common semiconductor material is crystalline silicon.

Solar cells have three main elements: (1) a semiconductor; (2) a semiconductor junction; and (3) conductive contacts. Semiconductors such as silicon may be doped n-type or p-type. If an n-type silicon and p-type silicon are formed in contact with one another, the region in the solar cell where they meet is a semiconductor junction. The semiconductor absorbs light. The energy from the light may be transferred to the valence electron of an atom in a silicon layer, which allows the valence electron to escape its bound state leaving behind a hole. These photogenerated electrons and holes are separated by the electric field associated with the p-n junction. The conductive contacts allow current to flow from the solar cell to an external circuit.

Figure 1:
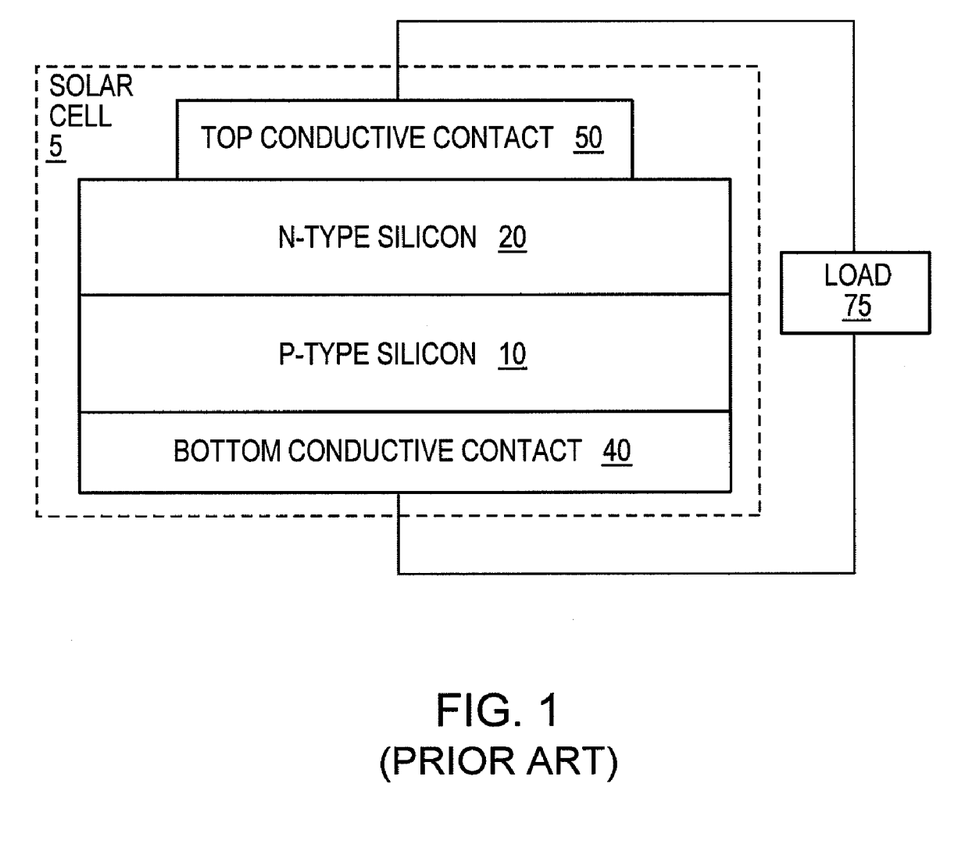
FIG. 1 is a cross-sectional view of a prior art solar cell.

FIG. 1 shows the basic elements of a prior art solar cell. The solar cells can be fabricated on a silicon wafer. The solar cell 5 comprises a p-type silicon base 10, an n-type silicon emitter 20, bottom conductive contact 40, and a top conductive contact 50. The p-type silicon base 10 and the n-type silicon emitter 20 contact one together to form the junction. The n-type silicon 20 is coupled to the top conductive contact 50. The p-type silicon 10 is coupled to the bottom conductive contact 40. The top conductive contact 50 and the bottom conductive contact 40 are coupled to a load 75 to provide it with electricity.

The top conductive contact 50 ("front contact"), comprising silver, enables electric current to flow into the solar cell 5. The top conductive contact 50, however, does not cover the entire face of the cell 5 because silver is not entirely transparent to light. Thus, the top conductive contact 50 has a grid pattern to allow light to enter into the solar cell 5. Electrons flow from the top conductive contact 50, and through the load 75, before uniting with holes via the bottom conductive contact 40.

The bottom conductive contact 40 ("rear contact" or "back contact") usually comprises aluminum-silicon eutectic. This conductive contact 40 typically covers the entire bottom of the p-type silicon 10 in order to maximize conduction. The aluminum is alloyed with silicon at high temperatures of approximately 750 degrees Celsius, well above the aluminum-silicon eutectic temperature of 577 degrees Celsius. This alloying reaction creates a heavily-doped p-type region at the bottom of the base and gives rise to a strong electric field there. This field aids in repelling the light-generated electrons from recombining with holes at the back contact so that they can be collected more efficiently at the p-n junction.

The interface between silicon and a conductive contact is typically an area having high recombination. For example, the back surface recombination velocity of an aluminum back surface field across the entire back surface may be 500 centimeters per second or more. High back surface recombination velocities decrease cell efficiency.

SUMMARY OF THE INVENTION

One method that has been used to reduce recombination at the back contact is to form a dielectric layer of silicon dioxide on the rear surface of the silicon wafer. This dielectric layer improves passivation, but creates other problems such as how to generate openings from the dielectric layer to the silicon, and optimizing the size and spacing of each window. In addition, the dielectric layer does not protect the silicon wafer from aluminum-silicon alloying during contact formation, which may deform the silicon wafer. Thin film silicon wafers are especially susceptible to deformation. The prior art solutions for reducing recombination at the back surface do not adequately address other issues such as preventing thin film silicon deformation, determining the size and spacing of dielectric openings, cleaning the dielectric openings, and forming quality back surface fields at the dielectric openings.

The solution as presented herein comprises a solar cell structure that has a dielectric passivation layer and a rear contact with local aluminum back surface field. A process for forming the rear contact is provided. In an embodiment, a dielectric layer is formed on the rear surface of a thin crystalline wafer having an n-region and a p-region. An opening is made in the dielectric layer by screen printing an etch paste, followed by a first heat treatment. A hydrofluoric acid solution may be used to remove any residue left by the etch paste. The rear contact is formed by screen printing a contact paste on the entire back surface followed by a second heat treatment. The contact paste is comprised of aluminum and from one to 12 atomic percent silicon. The presence of the silicon in the contact paste saturates the appetite of aluminum for silicon during the second heat treatment, and provides a high-quality back surface field contact at the local openings. The use of little or no glass frit in the aluminum helps to avoid significant aluminum spiking through the dielectric layer which degrades device performance.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components, and circuits have not been described in detail so as not to obscure the present invention.

Figure 2:
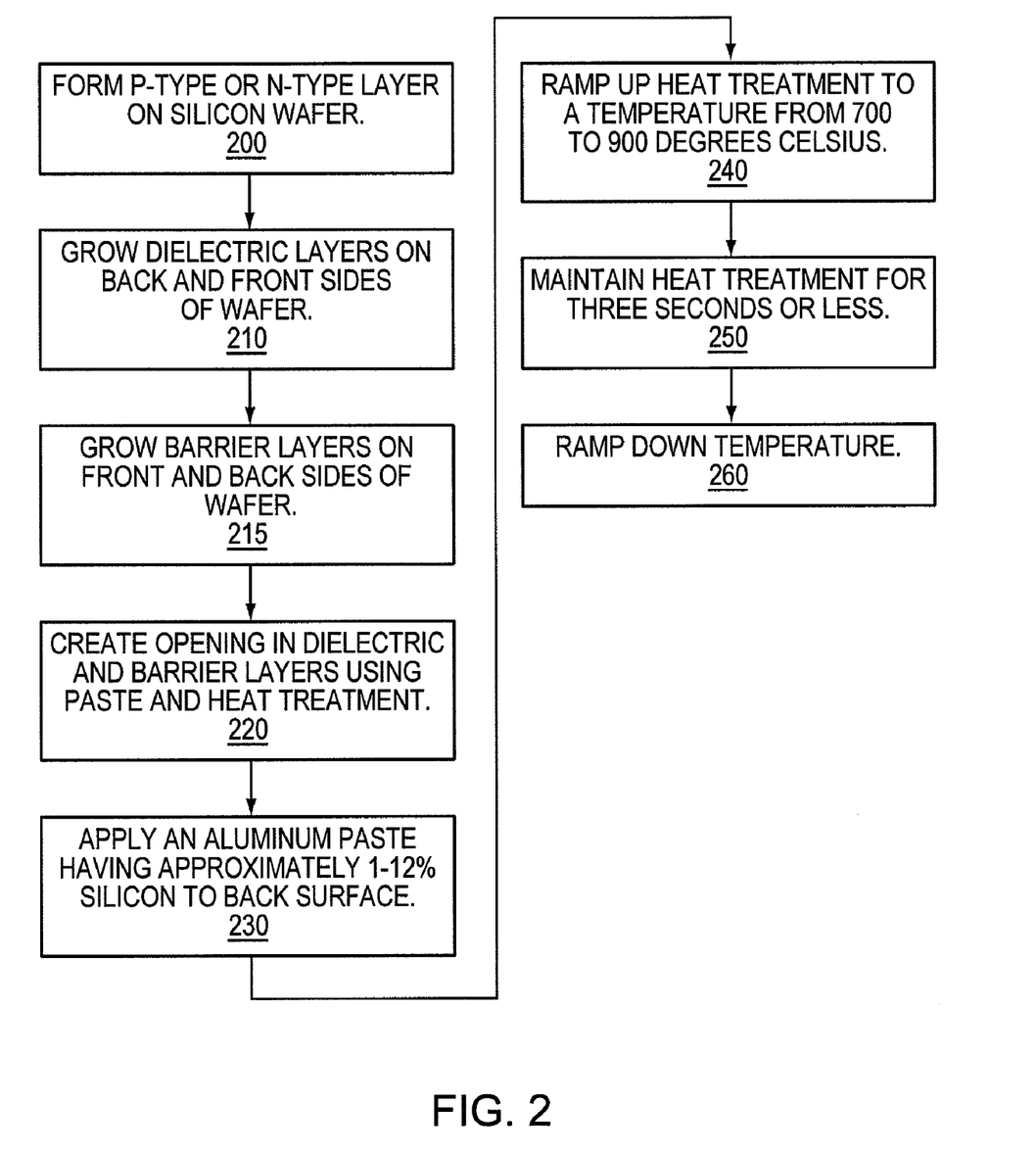
FIG. 2 is a flowchart for one embodiment of a process for forming a back contact with local back surface field.

FIG. 2 depicts a flowchart for forming a high quality rear contact that protects the silicon wafer from damage during the alloying process and provides a local back surface field. A local back surface field (BSF) is desirable because it helps to reduce the recombination of electrons at the solar cell's back surface. Efficiency of the solar cell is thereby increased if the solar cell has a high quality local BSF.

In operation 200, a p-type or n-type layer is formed on a silicon wafer. The silicon wafer may be crystalline. The silicon wafer may have a thickness from 200 to 250 micrometers. For another embodiment, the silicon wafer may have a thickness from 50 to 500 micrometers. Aluminum-silicon alloying across the entire back surface of the silicon wafer may deform thin silicon wafers. Thus, rather than forming full area contacts directly on the silicon wafer, barrier and dielectric layers are grown on the front and back sides of the silicon wafer in operation 210. The dielectric layers may be grown concurrently or simultaneously. For one embodiment of the invention, the dielectric layers are silicon dioxide. For another embodiment of the invention, the dielectric layers may be aluminum oxide.

Silicon dioxide may be formed through a spin-on process to achieve a thickness from 1000 to 5000 angstroms on each side. During the spin-on process, the dielectric in liquid form is deposited onto spinning wafers. The spin-on precursor may be a silicon dioxide sol-gel. Silicon dioxide sol-gel is commercially available from Filmtronics, Inc. under the name "20B." After the spin-on process, the wafer is dried at a temperature from 150 to 250 degrees Celsius for between 10 and 20 minutes. The silicon dioxide may be cured in oxygen ambient at a temperature from 875 to 925 degrees Celsius in a conventional tube furnace. The spin-on process enables a thicker, more uniform, silicon dioxide layer to be formed, which makes the dielectric a diffusion mask for single sided diffusion.

Alternatively the silicon dioxide may be formed via a chemical vapor deposition process or plasma enhanced chemical vapor deposition (PECVD) process. Such process may use silane and oxygen as precursors at a temperature from 300 to 500 degrees Celsius for 10 to 20 minutes. A reaction chamber may be used to control the reactants for this process.

In operation 215, a barrier layer is formed on the front and back sides of the wafer. The barrier layer may be comprised of silicon nitride having a thickness from 100 to 700 angstroms. The silicon nitride layer may be formed using PECVD. Silane and ammonia may be PECVD precursors of silicon and nitride, respectively. Alternatively, the silicon nitride layer may be formed using a low pressure chemical vapor deposition process in a suitable reaction chamber. The barrier layer on the front surface provides an anti-reflective coating to help absorb light. The barrier layers also protect the dielectric layers. Without the barrier layer on the back surface, the back surface dielectric layer may be subjected to aluminum spiking and impurities through the air. Moreover, the dielectric layers are more vulnerable to damage by high temperature during the firing of the screen printed contacts without the barrier layers.

In operation 220, at least one opening is formed in the dielectric and barrier layers on the back side of the silicon wafer. If a plurality of openings are formed, the openings may be evenly distributed across the surface of the silicon wafer. For one embodiment of the invention, the opening is made by applying a solar etch paste to the barrier layer. An exemplary solar etch paste is that manufactured by Merck & Co., Inc. under the name "Solar Etch AX M1." The solar etch paste may also be used to make openings to the front surface dielectric layer. The etch paste may comprise phosphoric acid, hydrofluoric acid, ammonium fluoride, or ammonium hydrogen fluoride. The openings formed in operation 220 may be in the shape of points or lines.

The paste should only be applied to the areas where openings in the dielectric layer are desired. The paste may be applied using a screen printing machine. The optimum size and spacing of the openings to the substrate are a function of the resistivity of the wafer. Computer programs such as Device Simulations for Smart Integrated Systems (DESSIS) may be used to determine the optimum size and spacing of the openings. DESSIS calculates optimum spacing based on parameters including contact type (point or line), contact size (75 micrometers or 150 micrometers), and lateral BSF (presence or absence). The simulation domain is derived from the smallest unit cell that can be extended periodically to represent the complete structure. To simplify the simulation problem, front contact parameters may be defined such that the front contact is uniformly distributed. Under this scenario, the size of the unit cell is controlled by the back contact geometry in the DESSIS simulation.

Figure 3A:
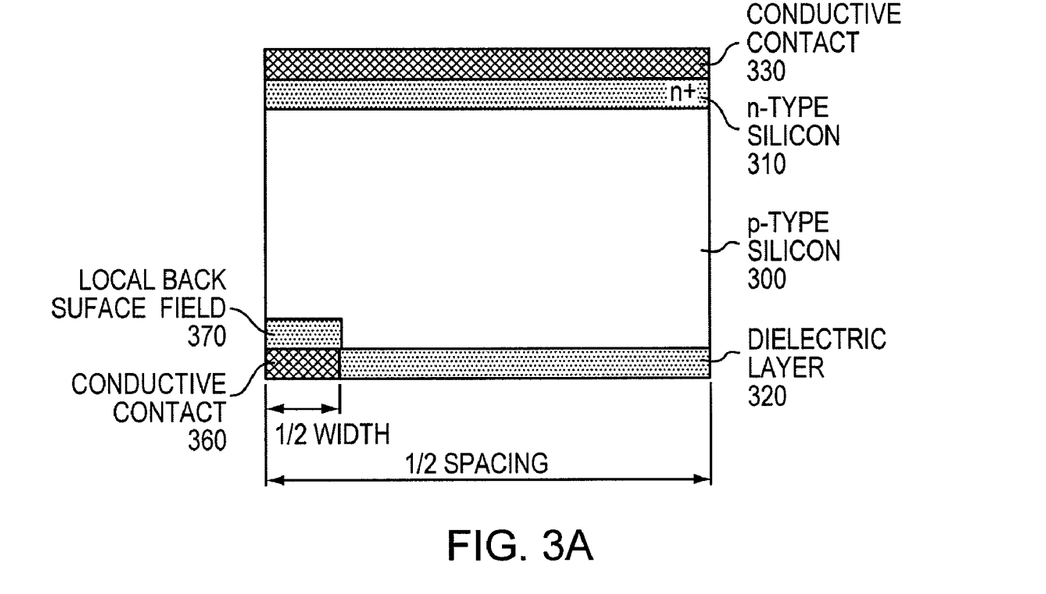
FIG. 3A is a DESSIS simulation domain for a line back contact.

The simulation domain for a line contact is shown in FIG. 3A. The simulation domain of FIG. 3A comprises a p-type silicon 300, an n-type silicon 310, a dielectric layer 320, a first conductive contact 330, a second conductive contact 360, and a local BSF 370. The p-type silicon 300 is coupled to n-type silicon 310, dielectric layer 320, and local BSF 370. The local BSF 370 is coupled to the second conductive contact 360. The n-type silicon 310 is coupled to the first conductive contact 330.

Figure 3B:
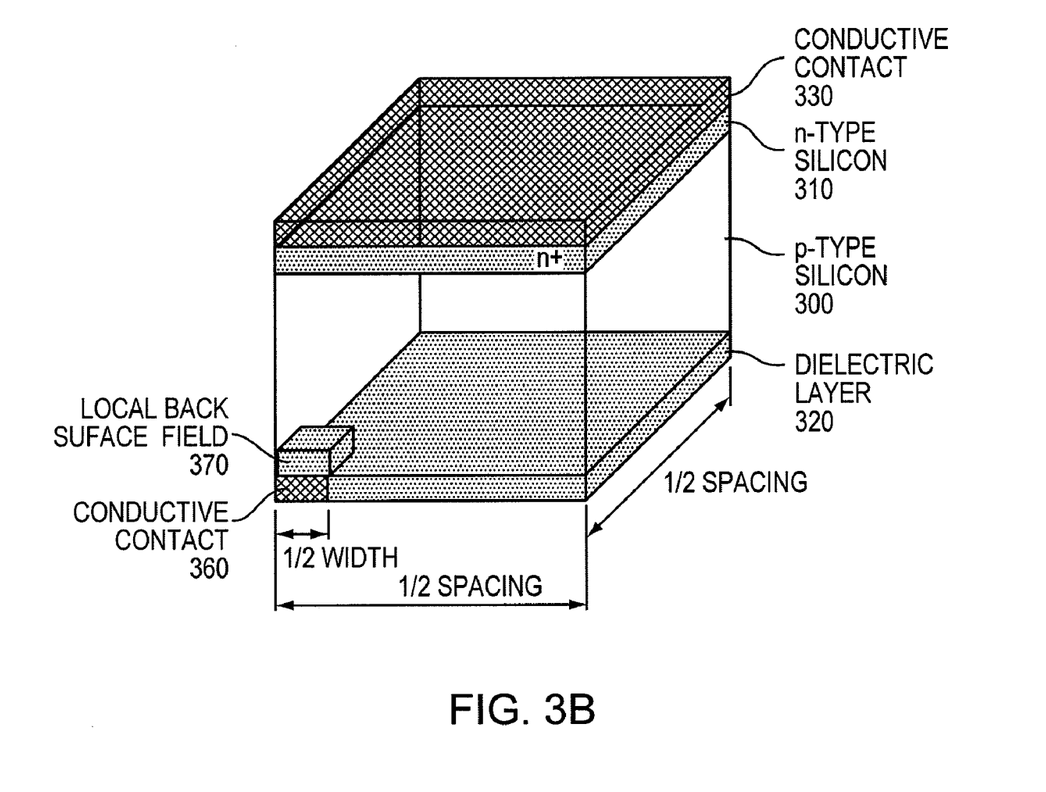
FIG. 3B is a DESSIS simulation domain for a point back contact.

Similarly, a simulation domain for a point contact is shown in FIG. 3B. The simulation domain of FIG. 3B comprises a p-type silicon 300, an n-type silicon 310, a dielectric layer 320, a first conductive contact 330, a second conductive contact 360, and a local BSF 370. The p-type silicon 300 is coupled to n-type silicon 310, dielectric layer 320, and local BSF 370. The local BSF 370 is coupled to the second conductive contact 360. The n-type silicon 310 is coupled to the first conductive contact 330.

The optical generation parameters may be set to assume a uniform light incident on a textured silicon surface having a facet angle of 54.7 degrees, an antireflection layer of index 2.0, and a thickness of 75 nanometers. The incident light may also be decreased by approximately 8.5 percent to account for shading by a front contact in the actual devices. The internal front surface reflection may be set to 92 percent. The back surface reflection may be set to 85 percent.

The emitter profile may be a Gaussian profile with a peak n-type doping concentration at the surface of $1.14 \times 10^{20}$ per cubic centimeter and a junction depth of 0.3 micrometers, which correspond to an emitter having a sheet resistance of approximately 80 ohms per square. Alternatively, an emitter sheet resistance may be varied from 70 to 90 ohms per square.

The local BSF at the back contact may be defined to have a constant p-type doping concentration of $1 \times 10^{19}$ per cubic centimeter with a thickness of 1.47 micrometers. This results in an effective surface recombination velocity of approximately 300 centimeters per second at the contact on a 2.0 ohm-centimeter substrate. To simulate for lateral BSF, the BSF layer may be extended laterally to at least 1.3 micrometers outside the contact edge. To simulate for no lateral BSF, the BSF layer may be defined to only cover the contact area.

Figure 4A:
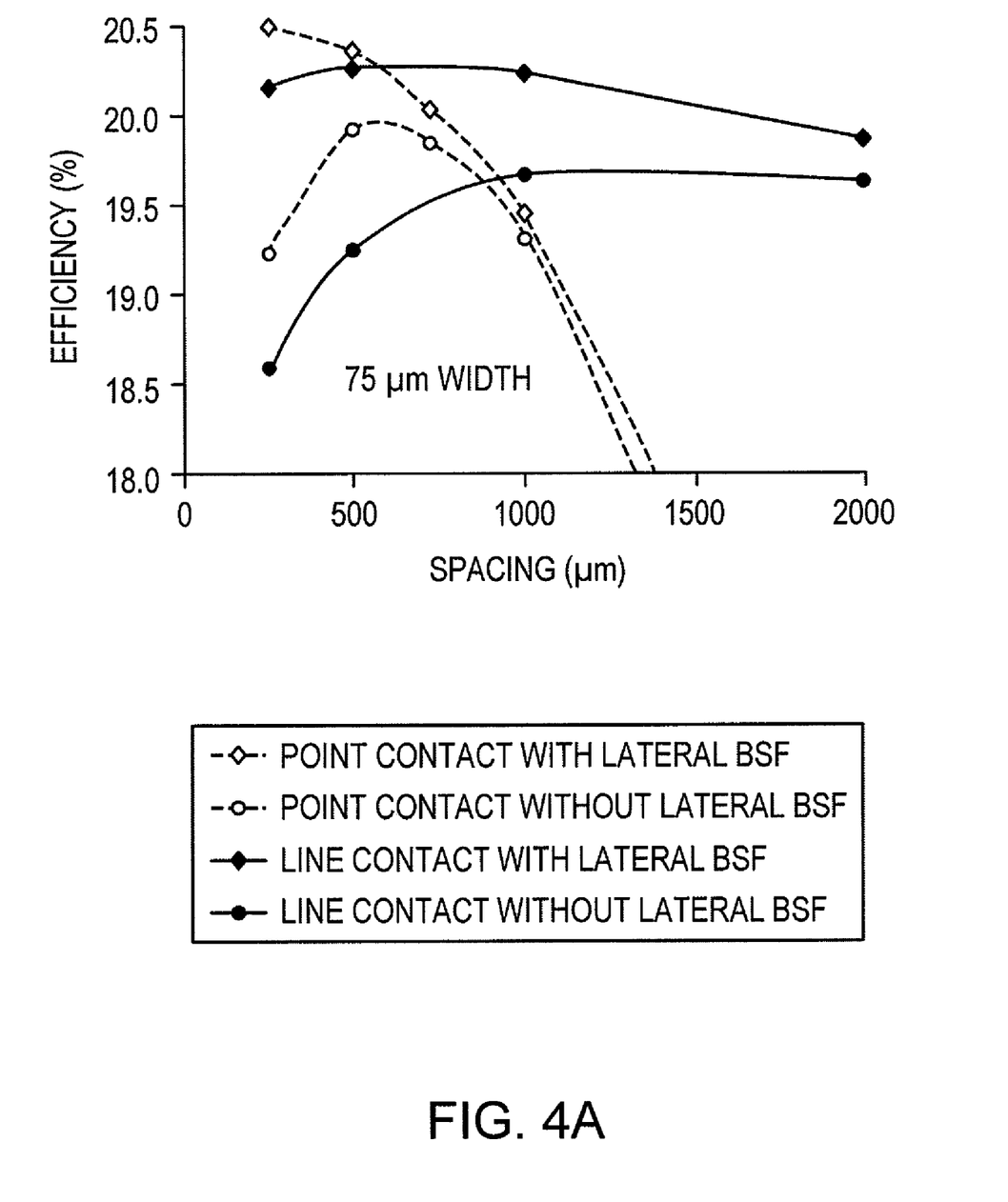
FIG. 4A is a DESSIS output graph that shows spacing versus efficiency for contacts having 75 micrometer width.
Figure 4B:
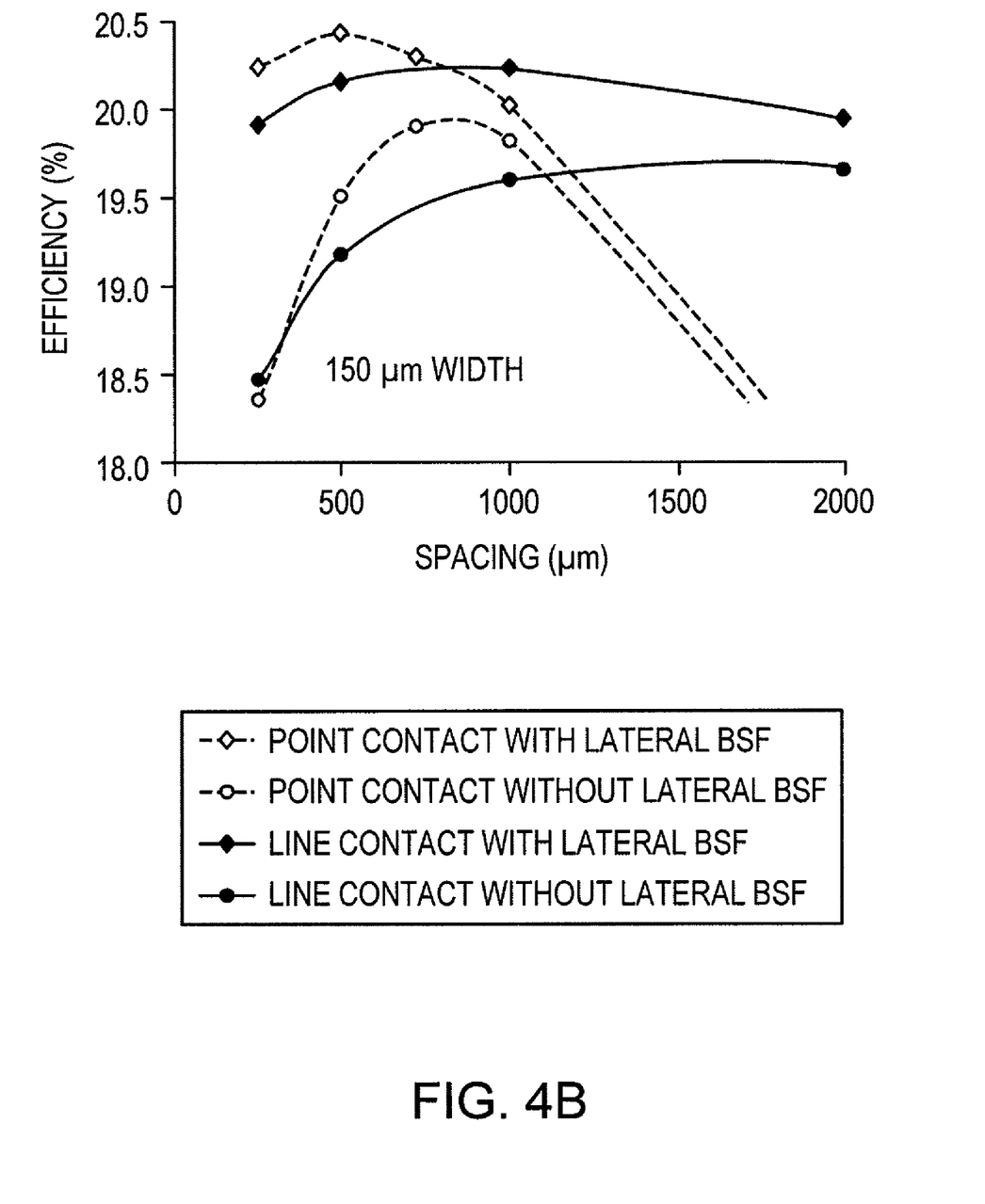
FIG. 4B is a DESSIS output graph that shows spacing versus efficiency for contacts having 150 micrometer width.

Other parameter settings may include a cell thickness from 50 to 200 micrometers, a resistivity from 1.5 to 2.5 ohm-centimeter, a front surface recombination velocity from 50,000 to 70,000 centimeters per second, a back surface recombination velocity at the dielectric from 40 to 60 centimeters per second, and a contact resistance of zero ohm-centimeter squared. Using these parameters, a DESSIS output graph depicting solar cell efficiency depending on contact spacing for contacts having a 75 micrometer width is shown in FIG. 4A, and a graph depicting solar cell efficiency depending on contact spacing for contacts having a 150 micrometer width is shown in FIG. 4B.

After applying the etch paste, the etch paste is exposed to a heat source at a temperature from 300 to 380 degrees Celsius for 30 to 45 seconds. The heat source coupled with the solar etch paste dissolves the barrier layer and the dielectric layer under the paste leaving an opening to the substrate. A hydrofluoric acid solution may be used to remove any resulting residue in or around the opening.

For another embodiment of the invention, the openings in the dielectric layer may be made using a laser or a mechanical scribe. The openings may cover one to 10 percent of the rear surface area. The dielectric layer remains on the remainder of the rear surface following operation 220.

In operation 230, a rear contact layer is applied with an aluminum paste that contains from one to 12 atomic percent silicon. For one embodiment of the invention, the aluminum paste may be product number: AL 53-090, AL 53-110, AL 53-120, AL 53-130, AL 53-131, or AL 5540 which are all commercially available from Ferro Corporation. For another embodiment of the invention, the aluminum paste may be commercially available aluminum paste manufactured by DuPont Corporation, Cermet Materials, Inc., Chimet Chemicals, Cixi Lvhuan Healthy Products, Daejoo Electronic Materials, Exojet Electronic, Hamilton Precision Metals, Inc., Metalor Technologies, PEMCO Corporation, Shanghai Daejoo, Young Solar, or Zhonglian Solar Technology. The aluminum paste may comprise fine aluminum particles dispersed in an organic vehicle. The organic vehicle may further comprise a binder such as ethyl cellulose or methyl cellulose and a solvent such as terpineol or carbitol. Silicon content is added to the aluminum paste such that the resulting "contact paste" comprises from one to 12 atomic percent silicon.

Figure 5A:
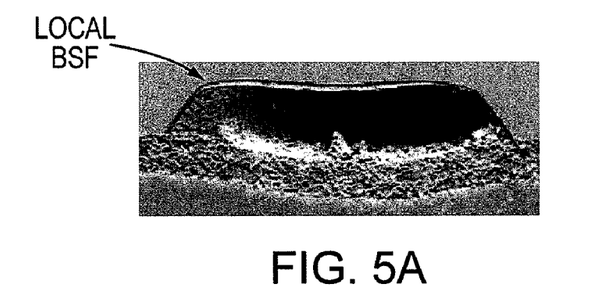
FIGS. 5A to 5D are cross-sectional views from an electron microscope of local back surface fields for different aluminum contact pastes.
Figure 5B:
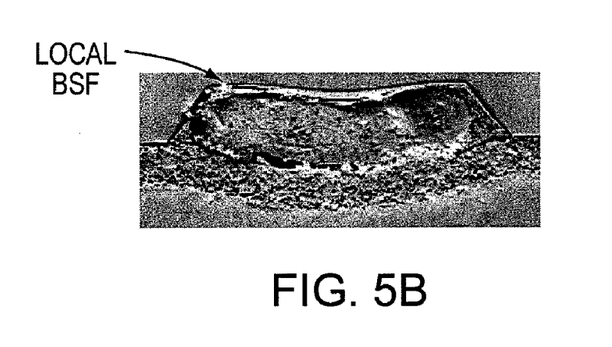
Figure 5C:
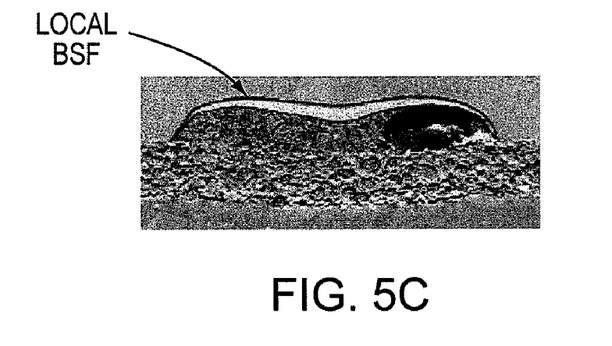
Figure 5D:
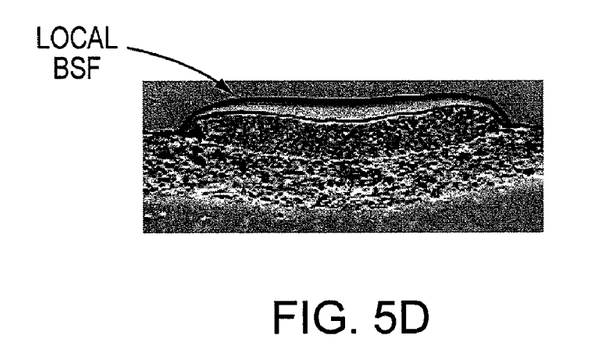

FIGS. 5A to 5D show that silicon content in the aluminum paste improves the formation of the local BSF. The quality of a BSF is defined by the uniformity and thickness of the BSF region. FIGS. 5A to 5D are cross-sectional views from a scanning electron microscope. FIG. 5A is a local BSF formed from a fritted aluminum paste. FIG. 5B is a local BSF formed from a fritless aluminum paste. FIG. 5C is a local BSF formed from a fritless aluminum paste having seven atomic percent silicon. FIG. 5D is a local BSF formed from a fritless aluminum paste having 12 atomic percent silicon. It is evident from FIGS. 5A to 5D that aluminum pastes having from one to 12 atomic percent silicon produce higher quality BSF than aluminum paste having no silicon content. A local BSF may help to achieve a good ohmic contact, especially on a substrate having high resistivity.

Moreover, the local BSF helps to minimize the effect of high recombination at the metal interface. The back surface recombination velocity of an aluminum BSF across the entire back surface is approximately 500 centimeters per second. In contrast, a dielectric back passivation with local aluminum BSF formed by an aluminum paste with 12 percent silicon reduces the back surface recombination velocity to 125 centimeters per second or less.

The contact paste with aluminum and silicon may be applied using a screen printing machine. For one embodiment of the invention, the contact paste is fritless. For another embodiment of the invention, the contact paste is low frit. Fritless or low frit aluminum does not etch or disturb the dielectric layer.

A heat treatment is next applied to the contact paste. In operation 240, the heat is "ramped up" to a temperature from 700 to 900 degrees Celsius. The ramp up time to the peak temperature is from one to five seconds. Silicon dissolves into the aluminum at a temperature greater than the eutectic temperature, which forms a molten aluminum and silicon alloy. The fast ramp up time helps to form a more uniform BSF. Once the peak temperature is reached, that temperature is maintained for three or less seconds in operation 250. For example, the peak temperature may be maintained from one to three seconds. Maintaining the peak temperature for this short period of time helps to prevent junction leakage current because there is less chance for impurities to diffuse to the junction.

Finally, the temperature is "ramped down" to 400 degrees Celsius or less in operation 260. The ramp down time is from three to six seconds. This fast ramp down time may be achieved through a forced cool down. For example, a fan or a drive belt that removes wafers from the heat source at a high speed may be used to rapidly ramp down the temperature to 400 degrees Celsius or less.

The fast ramp down provides for passivation in the bulk region. In one embodiment of the invention, the barrier layer may comprise a hydrogen concentration from $4 \times 10^{21}$ to $7 \times 10^{22}$ atoms per cubic centimeter. Hydrogen may be incorporated into the silicon nitride layer by the PECVD precursors. During the heat treatment, hydrogen may thus be disassociated from the barrier layer. The hydrogen atoms may then help passivation in the bulk region of the silicon wafer by attaching to defects in the silicon.

The solubility of silicon in aluminum is proportional to the temperature of the alloy. Therefore, during cool-down, the percentage of silicon in the alloy decreases. Excess silicon is rejected from the melt and regrows epitaxially at the silicon liquid interface. This regrowth layer gets doped with aluminum according to the finite solid solubility of aluminum in silicon at the solidification temperature. The regrowth layer, consequently, becomes a p+BSF layer.

If pure aluminum is used rather than the aluminum and silicon combination, the aluminum has an appetite for silicon at high temperatures. As a result, the rejection of silicon onto the silicon surface in the openings is decreased. This degrades the quality of rear surface passivation and lowers the cell performance.

The dielectric layer coupled with the aluminum rear contact having silicon also serves to improve absolute cell efficiency. Absolute cell efficiency is measured by a solar cell's ability to convert incoming light into energy. A full area aluminum eutectic back contact has a back surface reflectance of approximately 60 percent. Back surface reflectance is defined by the percentage of incident light that is reflected by the back surface back into the silicon. The back contact disclosed in this invention produces a back surface reflectance of greater than 85 percent. The dielectric layer coupled to the aluminum and silicon rear contact improves the cell efficiency by one to two percent.

The one to 12 atomic percent silicon additive in the contact paste serves to saturate the aluminum of silicon. Because the aluminum has a silicon concentration, more silicon is rejected from the melt to the opening during cool down. The rejected silicon has an aluminum concentration and regrows epitaxially at the silicon liquid interface forming a p+BSF layer. Lab tests, the results of which are depicted in FIGS. 5A to 5D, have shown that with the silicon additive, a local BSF depth from six to 15 micrometers may be achieved.

The rear contact is traditionally applied directly over the entire back surface of the silicon wafer. If silicon is added to the aluminum paste and applied to the full back surface of the substrate, then one will observe a reduction in the BSF layer thickness because less silicon will be dissolved from the silicon substrate. Thus, it is contrary to conventional wisdom to add silicon to aluminum paste. The inventors, however, have uncovered that the addition of silicon to the aluminum paste increases the depth of BSF for a local opening geometry. In the absence of silicon in the aluminum paste, the aluminum layer away from the openings needs greater than 12 atomic percent silicon to stay in equilibrium during the cool-down. This reduces the amount of silicon available for regrowth in the openings, resulting in thinner local BSF. The addition of silicon to the aluminum paste satisfies the appetite for silicon in the aluminum. Therefore, most of the silicon in the molten aluminum-silicon alloy in the openings is available for regrowth, resulting in thicker local BSF.

In addition to improving BSF, the contact paste with silicon may help to prevent aluminum spiking. The solubility of silicon in aluminum rises as temperature increases. As silicon diffuses into the aluminum, the aluminum will in turn fill voids created by the departing silicon. If the aluminum penetrates the p-n or $p^+$-p junction of the silicon wafer, a lower performance will result.

As discussed above, because the contact paste has from one to 12 atomic percent silicon, the aluminum will already be saturated with silicon atoms. Thus, silicon atoms from the substrate are prevented from diffusing into the aluminum layer during the heat treatment. Aluminum spiking is thereby avoided since no voids will be created in the substrate by departing silicon.

Figure 6A:
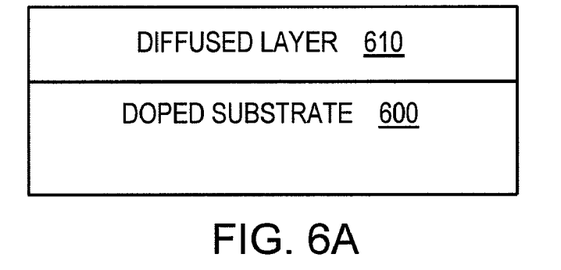
FIGS. 6A to 6E are cross-sectional views for one embodiment of a silicon wafer at each stage of the back contact fabrication process.

FIGS. 6A through 6D depict cross sectional views for one embodiment of a silicon wafer at various stages in the fabrication process. FIG. 6A depicts a silicon wafer having a doped substrate 600 coupled to a diffused layer 610.

Figure 6B:
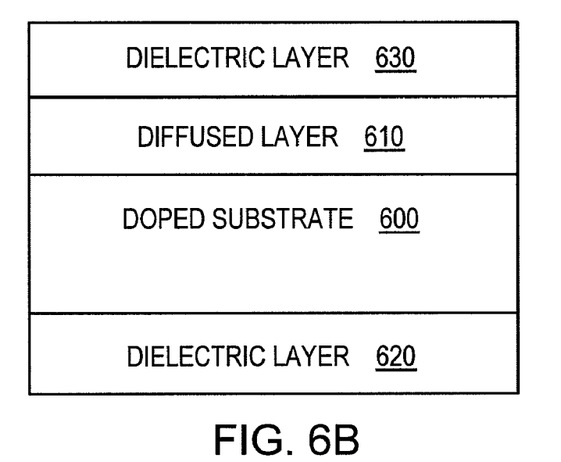

A dielectric layer 620 is coupled to doped substrate 600 in FIG. 6B. In addition, a dielectric layer 630 is coupled to diffused layer 610. This dielectric layer 620 may be silicon dioxide. The dielectric layer 620 may be formed by a spin-on process as described above.

Figure 6C:
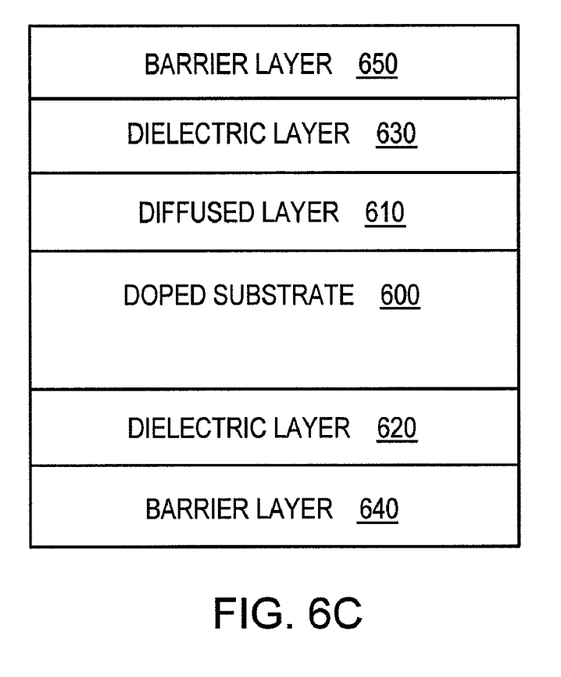

FIG. 6C depicts a barrier layer 640 that is coupled to the dielectric layer 620 and a barrier layer 650 that is coupled to the dielectric layer 630. The barrier layers 640 and 650 may be comprised of silicon nitride that is formed by PECVD. The barrier layers 640 and 650 provide protection to the dielectric layers. Moreover, barrier layer 650 may provide an anti-reflective coating to the front surface of the solar cell.

Figure 6D:
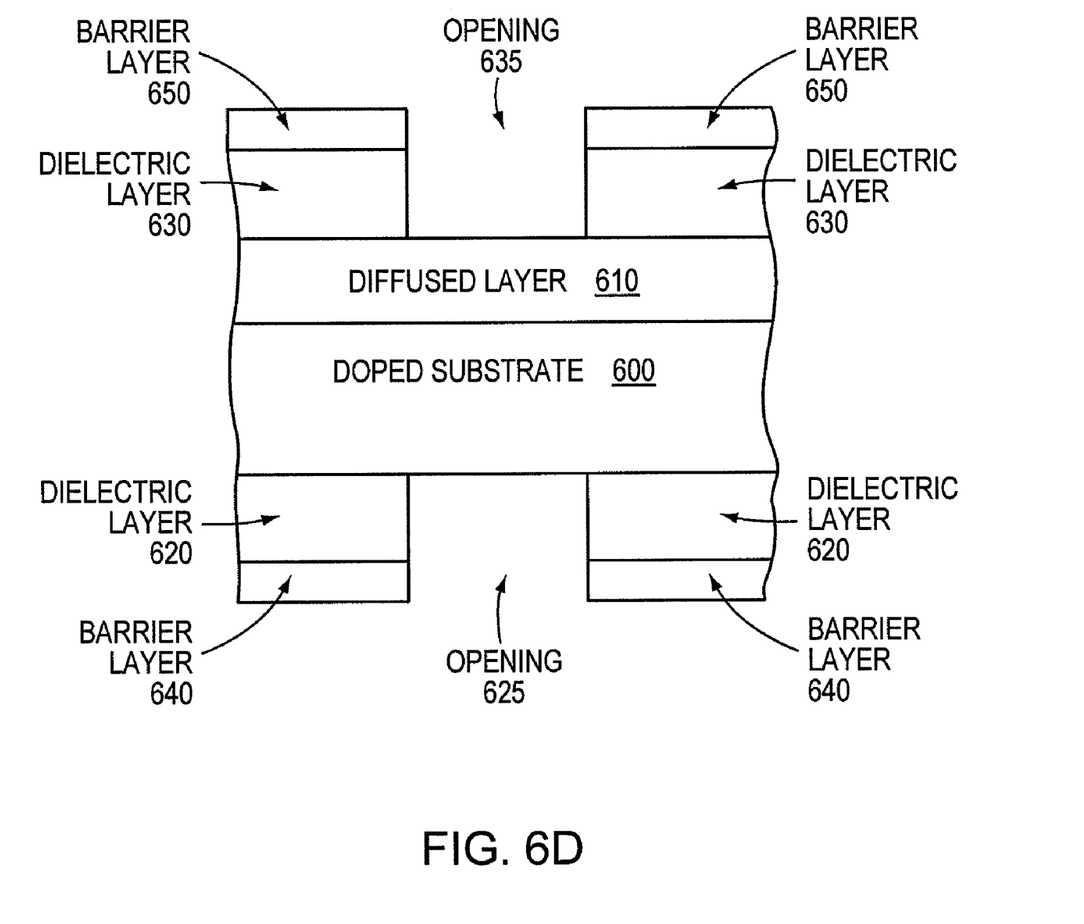
Figure 8:
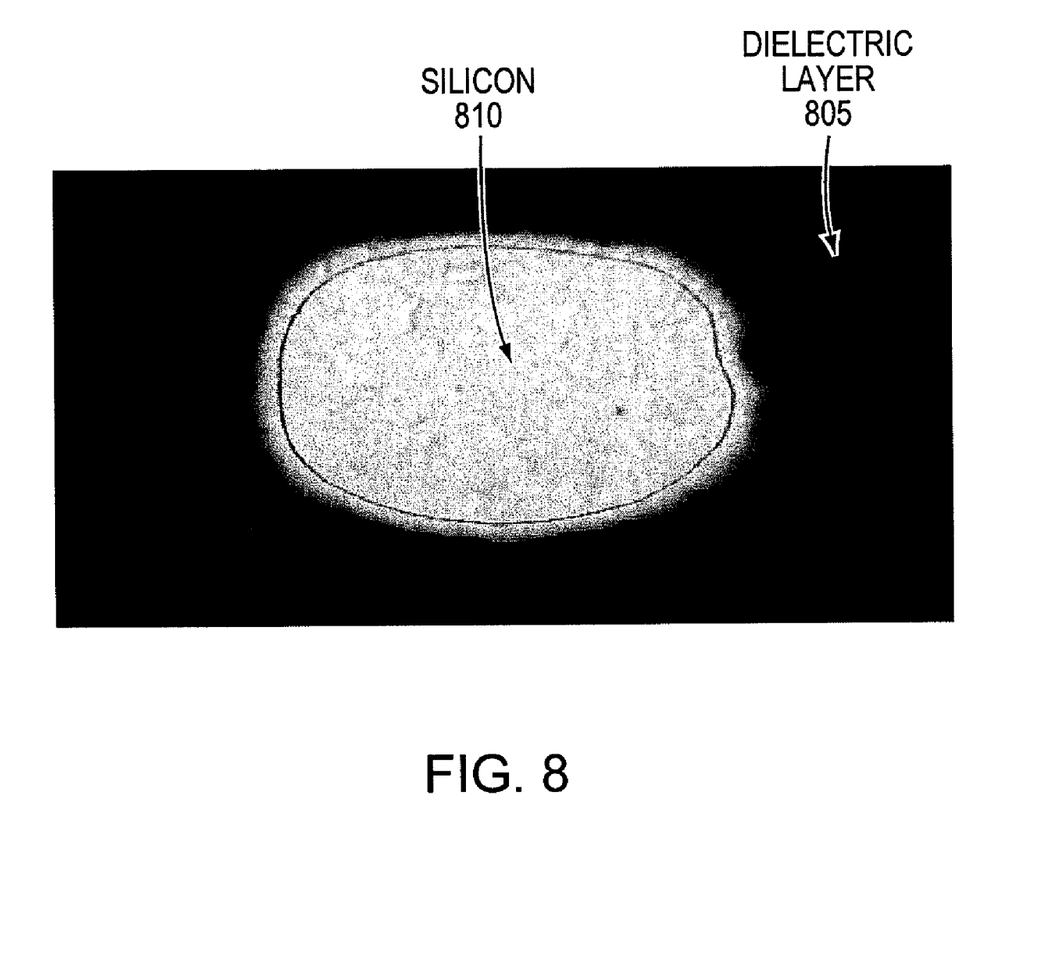
FIG. 8 is a top view from an electron microscope of an opening of a dielectric layer exposed with a screen printing etch paste.

FIG. 6D depicts an opening 625 in the dielectric layer 620 and the barrier layer 640. An opening 635 may also be formed in dielectric layer 630 and barrier layer 650. For one embodiment of the invention, the opening 625 and opening 635 may be formed by applying a solar etch paste to the dielectric layer and then applying a heat treatment to the dielectric layer. The heat treatment may involve a temperature from 300 to 380 degrees Celsius. The heat treatment dissolves the dielectric layer under the paste, forming an opening to the silicon 810 in the dielectric layer 805 as shown in FIG. 8. FIG. 8 depicts a bottom plan view of dielectric layer 805 having opening to the silicon 810. For another embodiment of the invention, the opening 625 and opening 635 may be formed by a laser. For yet another embodiment of the invention, the opening 625 and opening 635 may be formed by a mechanical scribe.

Figure 7A:
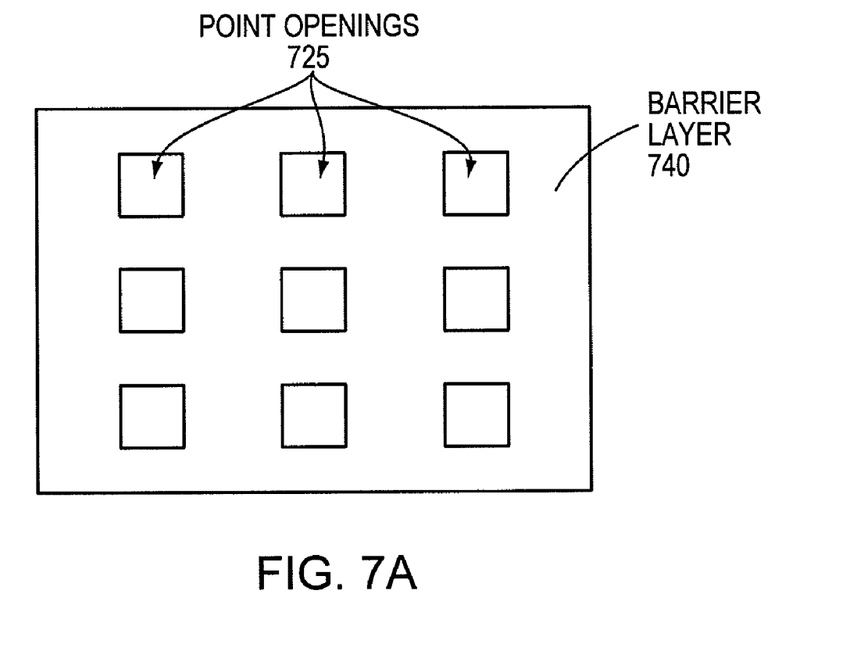
FIG. 7A is a bottom plan view for one embodiment of window openings to silicon having a point pattern.
Figure 7B:
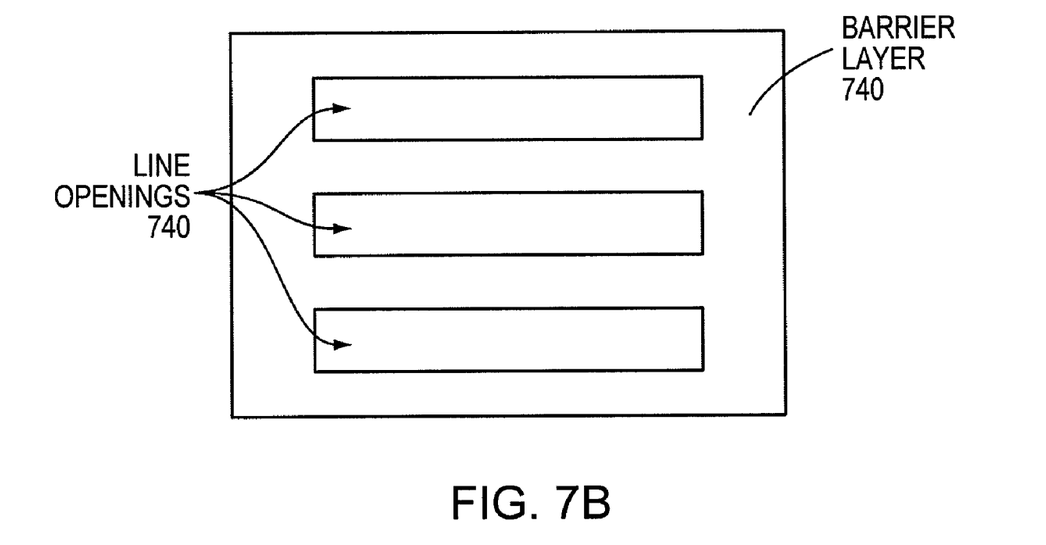
FIG. 7B is a bottom plan view for one embodiment of window openings to silicon having a line pattern.

The opening 625 may be in the form of a point or a line. FIG. 7A shows a bottom plan view of a barrier layer 740 having openings 725 to the silicon in a point pattern. Point openings may have a rectangular or circular shape. FIG. 7B shows a bottom plan view of a barrier layer 740 having openings 725 to the silicon in a line pattern.

Figure 6E:
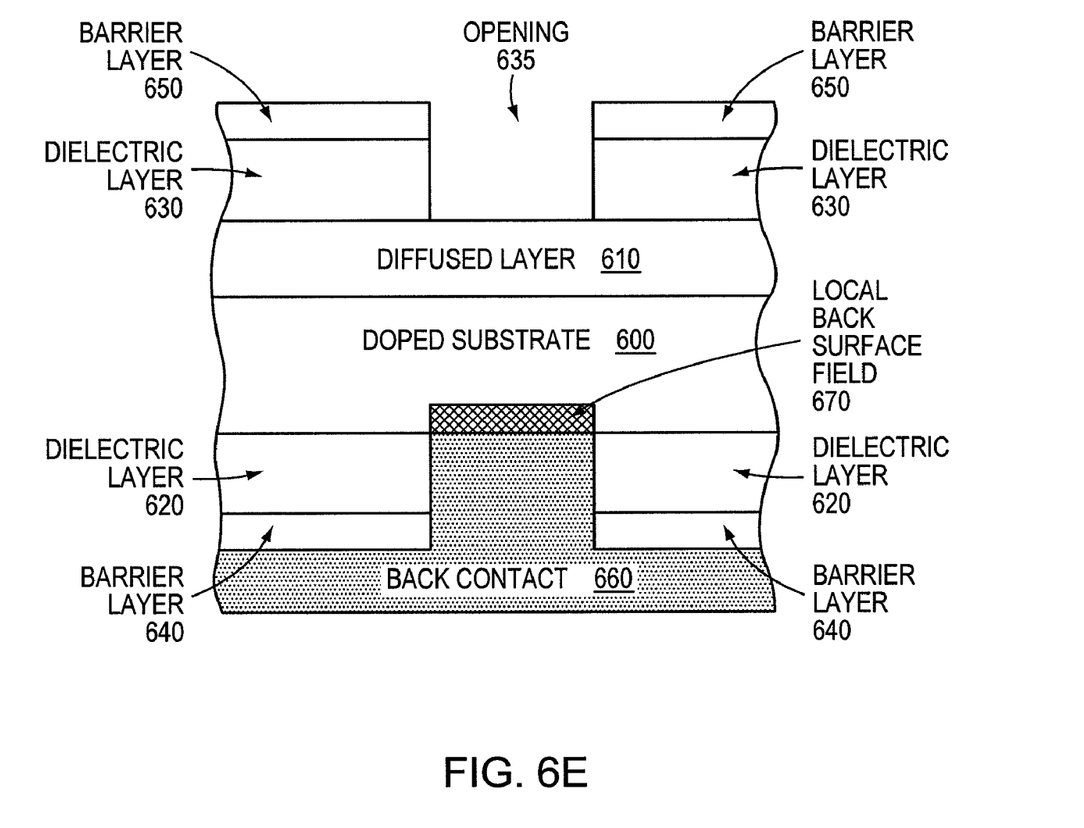

FIG. 6E depicts a rear contact 660 that is coupled to the dielectric layer 620, barrier layer 640, and the doped substrate 600 via the opening 625. This rear contact may be comprised of aluminum having from one to 12 atomic percent silicon. The addition of the silicon in the aluminum provides for a high quality BSF 670 having a depth from six to 15 micrometers.

In the forgoing specification, the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. A method, comprising:
    forming a diffused layer on a doped substrate of a thin silicon wafer, wherein the silicon wafer has a front surface and a back surface;
    forming a dielectric layer on at least the back surface of the silicon wafer;
    forming a barrier layer on the dielectric layer;
    removing a portion of the barrier layer and the back surface dielectric layer to form an opening to the substrate;
    applying an aluminum paste having elemental silicon to the opening and the back surface of the silicon wafer, wherein the aluminum paste comprises from one to 12 atomic percent silicon; and applying a heat treatment to the aluminum paste, wherein the aluminum paste is heated to a peak temperature from 700 to 900 degrees Celsius.

2. The method of claim 1, wherein the silicon wafer is a crystalline silicon wafer.

3. The method of claim 1, wherein the silicon wafer has a thickness from 50 to 500 micrometers.

4. The method of claim 1, wherein a portion of the back surface dielectric layer is removed by a laser.

5. The method of claim 1, wherein the aluminum paste is fritless.

6. The method of claim 1, wherein the aluminum paste is low frit.

7. The method of claim 1, wherein the aluminum paste is applied by a screen printing machine.

8. The method of claim 1, wherein the dielectric layer is silicon dioxide.

9. The method of claim 1, wherein the barrier layer is silicon nitride.

10. The method of claim 1, wherein the barrier layer is formed by a plasma enhanced chemical vapor deposition process.

11. The method of claim 1, wherein the removing of the portion of the back surface dielectric layer is performed by screen printing an etch paste and applying a heat treatment to the etch paste.

12. The method of claim 11, wherein the heat treatment applied to the etch paste is at a temperature from 300 to 380 degrees Celsius.

13. The method of claim 12, wherein the heat treatment to the etch paste is applied for between 30 and 45 seconds.

14. The method of claim 11, further comprising:
determining etch paste application to portions of the surface area of the dielectric layer using a simulation system.

15. The method of claim 14, further comprising:
entering parameters into the simulation system for determining etch paste application, wherein the parameters comprise an emitter sheet resistance, a cell thickness, a resistivity, a front surface recombination velocity, a back surface recombination velocity at the dielectric, and a contact resistance.

16. The method of claim 15, wherein the emitter sheet resistance is from 70 to 90 ohms per square, the cell thickness is from 90 to 200 micrometers, the resistivity is from 1.5 to 2.5 ohm-centimeter, the front surface recombination velocity is from 50,000 to 70,000 centimeters per second, the back surface recombination velocity of the dielectric is from 40 to 60 centimeters, and the contact resistance is zero ohm-centimeter squared.

17. The method of claim 1, wherein the heat treatment to the aluminum paste has a ramp up time from one to five seconds.

18. The method of claim 17, wherein the heat treatment to the aluminum paste is maintained at the peak temperature for from one to three seconds.

19. The method of claim 18, wherein the heat treatment to the aluminum paste has a ramp down time from three to six seconds to enable hydrogen passivation in the substrate.

* * * * *